US010388720B2

(12) United States Patent
Lue et al.

(10) Patent No.: US 10,388,720 B2
(45) Date of Patent: Aug. 20, 2019

(54) CAPACITOR WITH 3D NAND MEMORY

(71) Applicant: MACRONIX INTERNATIONAL CO., LTD., Hsinchu (TW)

(72) Inventors: Hang-Ting Lue, Hsinchu (TW); Teng-Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 83 days.

(21) Appl. No.: 15/279,203

(22) Filed: Sep. 28, 2016

(65) Prior Publication Data

US 2017/0018570 A1   Jan. 19, 2017

Related U.S. Application Data

(62) Division of application No. 14/739,717, filed on Jun. 15, 2015, now abandoned.

(51) Int. Cl.
*H01L 27/02* (2006.01)
*H01L 27/06* (2006.01)
(Continued)

(52) U.S. Cl.
CPC .......... *H01L 28/90* (2013.01); *H01L 27/0207* (2013.01); *H01L 27/0629* (2013.01);
(Continued)

(58) Field of Classification Search
CPC .......... H01L 27/11582; H01L 27/0629; H01L 27/11556; H01L 27/11573; H01L 27/0207;
(Continued)

(56) References Cited

U.S. PATENT DOCUMENTS 6,034,882 A   3/2000 Johnson et al.
6,063,688 A   5/2000 Doyle et al.
(Continued)

FOREIGN PATENT DOCUMENTS

EP   1936681 A1   6/2008
EP   2048709 A2   4/2009
WO   2004025659 A1   3/2004

OTHER PUBLICATIONS

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223. (cited in parent application).
(Continued)

*Primary Examiner* — Dale E Page
*Assistant Examiner* — Quovaunda Jefferson
(74) *Attorney, Agent, or Firm* — Yiding Wu; Haynes Beffel & Wolfeld LLP

(57) ABSTRACT

An integrated circuit includes a 3D NAND memory array with a stack of conductive strips and a capacitor with a stack of capacitor terminal strips. Multiple conductive strips in the stack of conductive strips, and multiple capacitor terminal strips of the stack of capacitor terminal strips, share a same plurality of plane positions relative to the substrate. Different plane positions in the same plurality of plane positions characterize different capacitor terminal strips in the stack of capacitor terminal strips and different conductive strips in the stack of conductive strips, and a same plane position characterizing both a conductive strip in the stack of conductive strips and a capacitor terminal strip in the stack of capacitor terminal strips indicates that the conductive strip and the capacitor terminal strip have a same vertical position relative to each other.

12 Claims, 14 Drawing Sheets

(51) Int. Cl.
*H01L 49/02* (2006.01)
*H01L 27/11526* (2017.01)
*H01L 27/11548* (2017.01)
*H01L 27/11556* (2017.01)
*H01L 27/11573* (2017.01)
*H01L 27/11575* (2017.01)
*H01L 27/11582* (2017.01)

(52) U.S. Cl.
CPC .. *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 28/60* (2013.01)

(58) Field of Classification Search
CPC ......... H01L 27/11548; H01L 27/11575; H01L 27/11526; H01L 28/60; H01L 28/90
See application file for complete search history.

(56) References Cited

U.S. PATENT DOCUMENTS

| | | | |
|---|---|---|---|
| 6,366,519 B1 | 4/2002 | Hung et al. | |
| 6,906,940 B1 | 6/2005 | Lue | |
| 6,933,224 B2 | 8/2005 | Nejad et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,301,818 B2 | 11/2007 | Lu et al. | |
| 7,382,647 B1 | 6/2008 | Gopalakrishnan | |
| 7,495,294 B2 | 2/2009 | Higashitani | |
| 7,646,625 B2 | 1/2010 | Philipp et al. | |
| 7,742,338 B2 | 6/2010 | Santin et al. | |
| 7,851,849 B2 | 12/2010 | Kiyotoshi | |
| 7,902,035 B2 | 3/2011 | Yu et al. | |
| 7,915,667 B2 | 3/2011 | Knoefler et al. | |
| 8,154,128 B2 | 4/2012 | Lung | |
| 8,208,279 B2 | 6/2012 | Lue | |
| 8,383,512 B2 | 2/2013 | Chen et al. | |
| 8,488,387 B2 | 7/2013 | Lue et al. | |
| 8,598,032 B2 | 12/2013 | Chen et al. | |
| 8,743,611 B2 | 6/2014 | Hioka | |
| 8,824,212 B2 | 9/2014 | Lue | |
| 8,891,293 B2 | 11/2014 | Du et al. | |
| 8,933,502 B2 | 1/2015 | Higashitani et al. | |
| 8,941,166 B2 | 1/2015 | Chen et al. | |
| 9,048,341 B2 | 6/2015 | Chen et al. | |
| 9,070,434 B2 | 6/2015 | Hioka et al. | |
| 9,190,499 B2 | 11/2015 | Hirai et al. | |
| 9,336,878 B2 | 5/2016 | Khwa et al. | |
| 9,620,210 B2 | 4/2017 | Khwa et al. | |
| 2003/0025147 A1 | 2/2003 | Nomoto et al. | |
| 2005/0280061 A1 | 12/2005 | Lee | |
| 2007/0215874 A1 | 9/2007 | Furukawa et al. | |
| 2008/0006869 A1 | 1/2008 | Kamigaichi et al. | |
| 2008/0073635 A1 | 3/2008 | Kiyotoshi et al. | |
| 2008/0101109 A1 | 5/2008 | Haring-Bolivar et al. | |
| 2009/0045445 A1 | 2/2009 | Yang et al. | |
| 2009/0097321 A1 | 4/2009 | Kim et al. | |
| 2009/0109737 A1 | 4/2009 | Kostylev | |
| 2009/0184360 A1 | 7/2009 | Jin et al. | |
| 2009/0230449 A1 | 9/2009 | Sakaguchi et al. | |
| 2009/0261479 A1 | 10/2009 | Hong | |
| 2010/0244269 A1 | 9/2010 | Kim | |
| 2010/0270593 A1 | 10/2010 | Lung et al. | |
| 2010/0314711 A1* | 12/2010 | Farooq .............. H01L 21/76898 257/506 |
| 2011/0051507 A1 | 3/2011 | Sarkar et al. | |
| 2011/0080781 A1 | 4/2011 | Goux | |
| 2011/0084397 A1 | 4/2011 | Lung | |
| 2011/0115010 A1* | 5/2011 | Shim ................. H01L 27/11565 257/314 |
| 2011/0140070 A1* | 6/2011 | Kim .......................... G11C 5/02 257/5 |
| 2011/0235403 A1 | 9/2011 | Kang | |
| 2012/0182807 A1 | 7/2012 | Lue | |
| 2012/0327708 A1 | 12/2012 | Du et al. | |
| 2013/0051126 A1 | 2/2013 | Kwong | |
| 2013/0113033 A1* | 5/2013 | Choi ................. H01L 29/66833 257/324 |
| 2013/0126957 A1 | 5/2013 | Higashitani et al. | |
| 2013/0130468 A1* | 5/2013 | Higashitani ......... H01L 29/7926 438/382 |
| 2014/0198582 A1 | 7/2014 | Freeman | |
| 2014/0226388 A1 | 8/2014 | Khoueir et al. | |
| 2015/0318296 A1 | 11/2015 | Kim et al. | |
| 2017/0053932 A1 | 2/2017 | Jeon | |

OTHER PUBLICATIONS

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4. (cited in parent application).

Hubert et al., "A Stacked SONOS technology, up to 4 levels and 6nm crystalline nanowires, with gate-all-around or independent gates (F Flash), suitable for full 3D integration", IEEE IEDM, Dec. 7-9, 2009, 2 pages. (cited in parent application).

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193. (cited in parent application).

Johnson et al., "512-MB PROM With a Three-Dimensional Array of Diode/Anti-fuse Memory Cells" IEEE J. of Solid-State Circuits, vol. 38, No. 11, Nov. 2003. (cited in parent application).

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006. (cited in parent application).

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137. (cited in parent application).

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189. (cited in parent application).

Kim, Jiyoung et al., "Novel 3-D Structure for Ultra High Density Flash Memory with VRAT (Vertical-Recess-Array-Transistor) and PIPE (Planarized Integration on the same PlanE)," Jun. 17-19, 2008, 2 pages. (cited in parent application).

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59. (cited in parent application).

Lai, et al., "A Multi-Layer Stackable Thin-Film Transistor (TFT) NAND-Type Flash Memory", IEEE Int'l Electron Devices Meeting, Dec. 11-13, 2006. (cited in parent application).

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225. (cited in parent application).

Paul et al., "Impact of a Process Variation on Nanowire and Nanotube Device Performance", IEEE Transactions on Electron Devices, vol. 54, No. 9, Sep. 2007, p. 2369-2376. (cited in parent application).

Tanaka, H., et al., "Bit Cost Scalable Technology with Punch and Plug Process for Ultra High Density Flash Memory," 2007 IEEE Symposium on VLSI Technology, Jun. 12-14, 2007, pp. 14-15. (cited in parent application).

Wikipedia, Double Patterning, downloaded on Jul. 29, 2010, 14 pages. (cited in parent application).

Xie et al., "Analysis of Higher-Order Pitch Division for Sub-32nm Lithography," Proc. SPIE 7274, Optical Microlithography XXII, 72741Y (Mar. 16, 2009), 8 pages. (cited in parent application).

(56) References Cited

OTHER PUBLICATIONS

Khwa, W. S., et al.; A Novel Inspection and Annealing Procedure to Rejuvenate Phase Change Memory from Cycling-Induced Degradations for Storage ClassMemory Applications; Electron Devices Meeting (IEDM), 2014 IEEE International; Jun. 18, 2014; 3 pgs.

Ahn, S. J. et al., "A Highly Manufacturable High Density Phase Change Memory of 64 Mb and Beyond," IEEE IEDM Dec. 13-15, 2004, pp. 907-910.

Chen, An et al., "Non-Volatile Resistive Switching for Advanced Memory Applications," IEEE IEDM, Dec. 5-7, 2005, 4 pp.

Gleixner, "Phase Change Memory Reliability", 22nd NVSMW, Aug. 26, 2007, 46 pages.

Kim, Kinam et al., "Reliability Investigations for Manufacturable High Density PRAM," IEEE 43rd Annual International Reliability Physics Symposium, San Jose, Apr. 17-21, 2005, pp. 157-162.

Lacita, A. L., "Electrothermal and Phase-change Dynamics in Chalcogenide-based Memories," IEEE IEDM Dec. 13-15, 2004, 4 pp.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Chen C-H et al., "Age-Based PCM Wear Leveling with Nearly Zero Search Cost," 49th ACM/EDAC/IEEE Design Automation Conference (DAC), San Francisco, Jun. 2012, pp. 453-458.

Li, Yiming et al.; Temperature dependence on the contact size of GeSbTe films for phase change memories; published online: Jan. 23, 2008; J Comput Electron (2008) 7: pp. 138-141.

Ahn, S. J. et al., "A Highly Manufacturable High Density Phase Change Memory of 64 Mb and Beyond," IEEE IEDM Dec. 13-15, 2004, pp. 907-910. cited byapplicant.

\* cited by examiner

CAPACITOR TERMINAL STRIP STACK

3D NAND ARRAY CONDUCTIVE STRIP STACK

CAPACITOR WITH 3D NAND MEMORY

CROSS-REFERENCE TO OTHER APPLICATIONS

This application is a divisional of U.S. patent application Ser. No. 14/739,717 filed on 15 Jun. 2015; which application is related to the following co-pending U.S. patent applications: U.S. patent application Ser. No. 13/049,303, filed 16 Mar. 2011, entitled REDUCED NUMBER OF MASK FOR IC DEVICE WITH STACKED CONTACT LEVELS, now U.S. Pat. No. 8,598,032; and U.S. patent application Ser. No. 13/114,931, filed 24 May 2011, entitled MULTILAYER CONNECTION STRUCTURE AND MAKING METHOD, now U.S. Pat. No. 8,383,512.

BACKGROUND OF THE INVENTION

Capacitors are electronic devices including two terminals separated by insulating material. When there is a voltage difference between the two terminals, an electric field is created between the two terminals thereby storing electrical energy. The amount of electrical charge that can be stored on a capacitor per volt across the terminals is referred to as capacitance. Terminals are typically in the form of plates of various shapes, surface contours and sizes. The capacitance is generally a function of the dielectric constant κ of the dielectric layer, directly proportional to the area of the opposed terminals and inversely proportional to the distance between the terminals. Placing two or more capacitors in parallel results in a total capacitance of the combination that is equal to the sum of the capacitances of the individual capacitors. Placing two or more capacitors in series results in a total capacitance of the combination that is less than the capacitance of any of the individual capacitors. Series connected capacitors are commonly used in high-voltage situations because the high-voltage is divided among the capacitors. While providing capacitors of various sizes is usually not a problem outside of an integrated circuit, conventional integrated circuits are limited to relatively small capacitors because of size limitations. See, for example, U.S. Pat. No. 5,497,016.

A stack of capacitors connected in parallel has a low area footprint from the bottom capacitor in the stack of capacitors, and yet a large capacitance from the summed capacitance of the capacitors in the stack connected in parallel. However, the stacked capacitor is fabricated by many steps which results in increased complexity and cost of the overall integrated circuit. It would be desirable to take advantage of the low area footprint, large capacitance of the stacked capacitor, while minimizing additional fabrication complexity and cost resulting from the addition of the stacked capacitor to an integrated circuit.

BRIEF SUMMARY OF THE INVENTION

Various aspects of the technology involve integrated circuits having both a 3D NAND memory array with a stack of conductive strips, and a stacked capacitor with a stack of capacitor terminal strips. Because the integrated circuit is already being fabricated to include a 3D NAND array, overall complexity is changed little from fabricating stacks of conductive strips for a capacitor in addition to the NAND memory array.

One aspect of the technology includes an integrated circuit with a substrate, a 3D NAND memory array with a stack of conductive strips, and a stacked capacitor with a stack of capacitor terminal strips. Multiple conductive strips in the stack of conductive strips, and multiple capacitor terminal strips of the stack of capacitor terminal strips, share a same plurality of vertical distances from the substrate.

In some embodiments of the technology, the stack of conductive strips is at least one of: transistor channels in the 3D NAND memory array, conductors routing signals that select memory cells in the 3D NAND memory array, and conductors routing output from the 3D NAND memory array. In one embodiment of the technology, the 3D NAND memory array is a vertical gate memory array, and the conductive strips in the stack are NAND transistor channels in the vertical gate memory array. In one embodiment of the technology, the 3D NAND memory array is a vertical channel memory array, and the conductive strips in the stack are word lines in the vertical channel memory array.

In one embodiment of the technology, the stack of capacitor terminal strips includes a first plurality of capacitor terminal strips alternating with a second plurality of capacitor terminal strips. The first plurality of capacitor terminal strips are electrically connected together and the second plurality of capacitor terminal strips are electrically connected together.

In one embodiment of the technology, the stack of capacitor terminal strips has a first end and a second end. Multiple capacitor terminal strips in the stack of capacitor terminal strips are electrically connected together at the first end, and multiple capacitor terminal strips in the stack of capacitor terminal strips are electrically connected together at the second end. The embodiment further comprises a conductive plug electrically connected to at least one of the capacitor terminal strips at an intermediate point in between the first end and the second end.

In one embodiment of the technology, the stack of capacitor terminal strips is one of a plurality of stacks of capacitor terminal strips having lengths between first ends and second ends. The plurality of stacks of capacitor terminal strips include the first plurality of capacitor terminal strips alternating with the second plurality of capacitor terminal strips. The first plurality of capacitor terminal strips in the plurality of stacks of capacitor terminal strips are electrically coupled together via the first ends and at intermediate points in between the first ends and second ends.

Another aspect of the technology is a computer readable medium comprising a layout for an integrated circuit including designs for a plurality of masks. The integrated circuit includes a 3D NAND memory array with a stack of conductive strips as described herein, and a capacitor with a stack of capacitor terminal strips as described herein. Multiple masks in the plurality of masks each define at least one conductive strip in the stack of conductive strips and at least one capacitor terminal strip in the stack of capacitor terminal strips.

A further aspect of the technology is a method of making an integrated circuit comprises:
  making a 3D NAND memory array with a stack of conductive strips as described herein, and a stacked capacitor with a stack of capacitor terminal strips as described herein, including:
    in a same etch, defining the stack of conductive strips and the stack of capacitor terminal strips.

Other features, aspects and advantages of the present invention can be seen on review the figures, the detailed description, and the claims which follow.

DETAILED DESCRIPTION OF THE INVENTION

Figure 1:
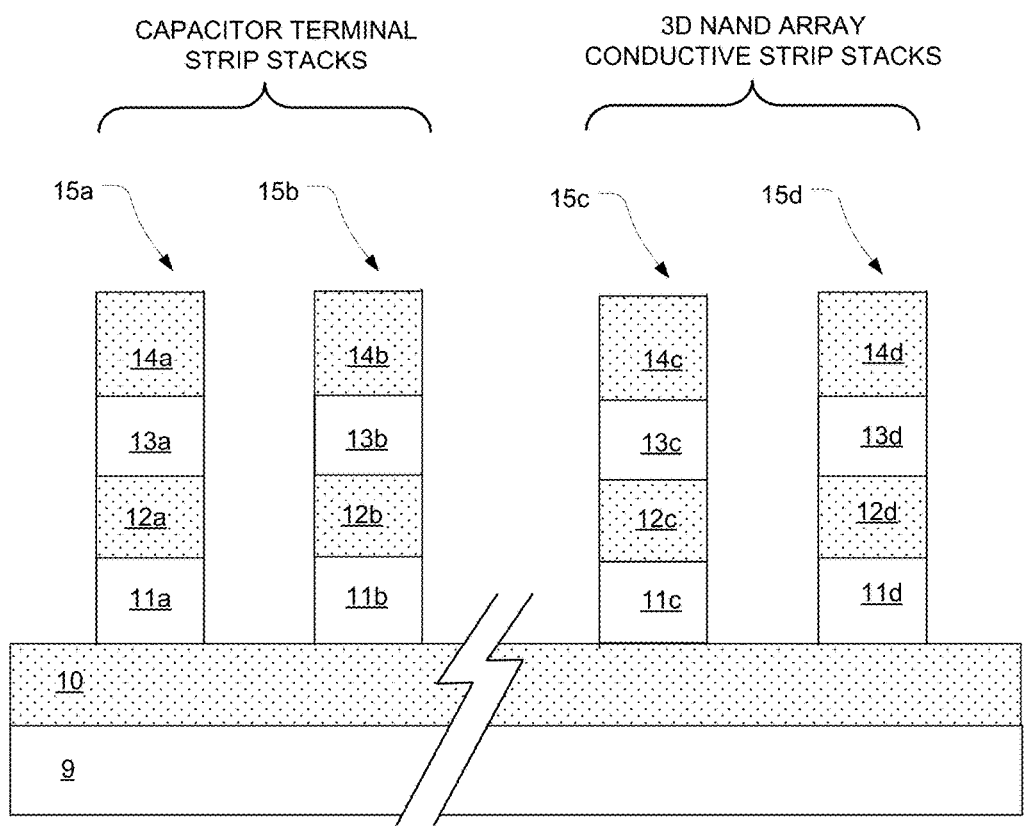
FIG. 1 is an end view of stacks of conductive material for both a capacitor and a 3D NAND array on a same substrate.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

It is widely recognized that capacitance is very useful electronic circuitry, but is expensive and has manufacturing difficulties when manufactured in semiconductors. Capacitance can be used to help reduce voltage variations and can be used to help save data in memory, such as SRAM, DRAM and Flash, either during normal operations or due to unexpected power failures. While there are system-level products for providing such capacitance, there may be advantages to providing it at the semiconductor level, including system cost, power and reliability.

FIG. 1 is an end view of stacks of conductive material for both a capacitor and a 3D NAND array on a same substrate. In this end view, the strips of conductive material and strips of insulator extend into and out of the page to the extent of the lengths of the strips of conductive material and strips of insulator.

The same insulator layer 10 is the base for stacks of conductive material that are in both a capacitor and a 3D NAND array. Insulator layer 10 is over a substrate layer 9. Stacks 15a and 15b are included in capacitor devices. Stacks 15c and 15d are included in a 3D NAND array.

The zigzag lines through the insulator layer 10 indicate that the capacitor and a 3D NAND array are spaced apart on the same insulator layer 10. In another embodiment, the stacks are spaced apart on a same conductive substrate, and the bottom of each stack is an insulator strip.

In stacks 15a, 15b, 15c, and 15d, strips of conductive material alternate with strips of insulator. For example, in stack 15a, an insulator strip 12a electrically insulates proximate strips of conductive material 11a and 13a in the same stack from each other. Insulator strip 14a is above top-most conductive material strip 13a. A same arrangement of insulator strips and conductive material strips is in stacks 15b, 15c, and 15d.

Conductive material strips 13a, 13b, 13c, and 13d share a same plane position and thus have a same vertical position relative to each other. Conductive material strips 11a, 11b, 11c, and 11d also share a same plane position and thus have a same vertical position relative to each other. Conductive material strips 13a, 13b, 13c, and 13d have a different plane position relative to conductive material strips 11a, 11b, 11c, and 11d; thus conductive material strips 13a, 13b, 13c, and 13d have a different vertical position relative to conductive material strips 11a, 11b, 11c, and 11d.

In an embodiment where the stacks share a common conductive substrate, the bottom insulator strip on the common conductive substrate isolates the conductive substrate shared by multiple stacks from the bottom-most conductive strip in each stack.

The strips of conductive material in both the capacitor terminal stacks and the 3D NAND array can be implemented using polysilicon or epitaxial single crystal silicon having n-type or p-type doping. The insulator strips can be implemented for example using silicon dioxide, other silicon oxides, or silicon nitride.

The 3D NAND array of the integrated circuit includes stacks 15c and 15d of strips of conductive material. So complexity and cost of the integrated circuit is not appreciably increased from the further inclusion of stacks 15a and 15b of strips of conductive material as capacitors of the integrated circuit.

Figure 2:
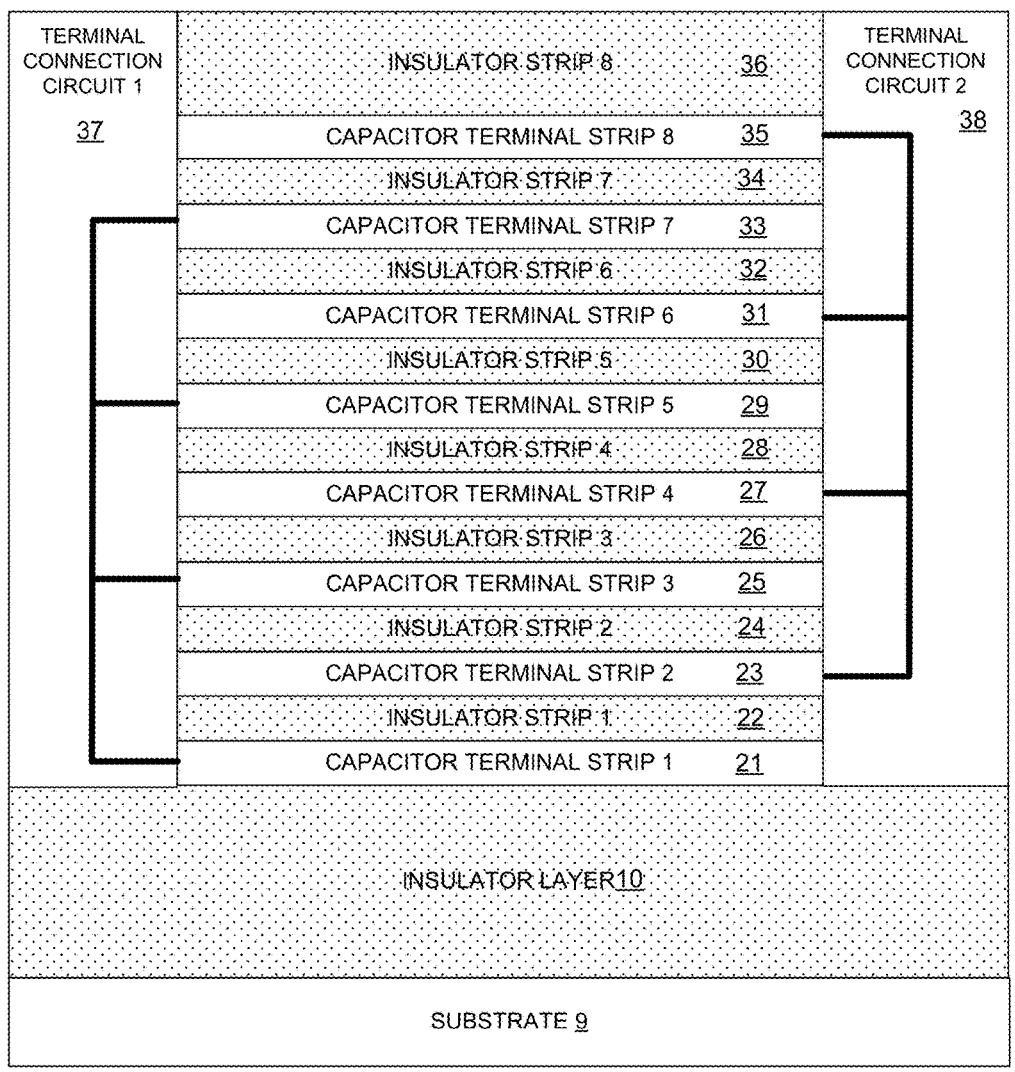
FIG. 2 is a side view of a capacitor with a stack of conductive material from FIG. 1.

FIG. 2 is a side view of a capacitor with a stack of conductive material from FIG. 1. In this side view, the strips of conductive material and strips of insulator extend into and out of the page to the extent of the widths of the strips of conductive material and strips of insulator.

Insulator layer 10 is the base for the stack of conductive material that in a capacitor device. Insulator layer 10 is over a substrate layer 9. Additional stacks of conductive material for additional capacitor device can be elsewhere on the insulator layer 10. Also, a 3D NAND array with multiple stacks of conductive material is elsewhere on the insulator layer 10. In another embodiment, the stack is on a conductive substrate, and the bottom of each stack is an insulator strip. The capacitor suppresses parasitic capacitance by omitting the well-to-substrate capacitance of well capacitors, which could be in the range of about tenths of picofarads.

In the stack, strips of conductive material alternate with strips of insulator. The stack includes capacitor terminal strip 1 21, capacitor terminal strip 2 23, capacitor terminal strip 3 25, capacitor terminal strip 4 27, capacitor terminal strip 5 29, capacitor terminal strip 6 31, capacitor terminal strip 7 33, and capacitor terminal strip 8 35. The stack also includes insulator strip 1 22, insulator strip 2 24, insulator strip 3 26, insulator strip 4 28, insulator strip 5 30, insulator strip 6 32, insulator strip 7 34, and insulator strip 8 36. Accordingly, the capacitor terminal strips alternate with insulator strips. An insulator strip electrically insulates proximate strips capacitor terminal strips in the same stack from each other.

The strips of conductive material in both the capacitor terminal stacks and the 3D NAND array can be implemented using polysilicon or epitaxial single crystal silicon having n-type or p-type doping. The insulator strips can be implemented for example using silicon dioxide, other silicon oxides, or silicon nitride.

Terminal connection circuit 1 37 and terminal connection circuit 2 38 electrically connect together capacitor terminal strips. Such terminal connection circuits electrically connect the multiple capacitors within the stack in parallel. As discussed below, the parallel connection sums the capacitances of the multiple capacitors within the stack, resulting in a high total capacitance of the stack. Terminal connection circuit 1 37 electrically connects the "odd" capacitor terminal strips, including capacitor terminal strip 1 21, capacitor terminal strip 3 25, capacitor terminal strip 5 29, and capacitor terminal strip 7 33. Terminal connection circuit 2 38 electrically connects the "even" capacitor terminal strips, including capacitor terminal strip 2 23, capacitor terminal strip 4 27, capacitor terminal strip 6 31, and capacitor terminal strip 8 35. The stack includes seven capacitors each having a respective one of the insulator strips as the capacitor's intermediate dielectric. The seven capacitors each have two terminals, including a first capacitor terminal which is one of the "odd" capacitor terminal strips, and a second capacitor terminal which is one of the "even" capacitor terminal strips.

Other embodiments have more or fewer capacitors in the stack. Other embodiments connect in parallel only a subset of the capacitors in the stack. Other embodiments connect in series two or more of the capacitors in the stack. Other embodiments connect in series two or more of the capacitors in the stack, and connect in parallel two or more of the capacitors in the stack. Other embodiments allow one or more of the intermediate terminals to float, to allow more leeway in the layout.

Figure 3:
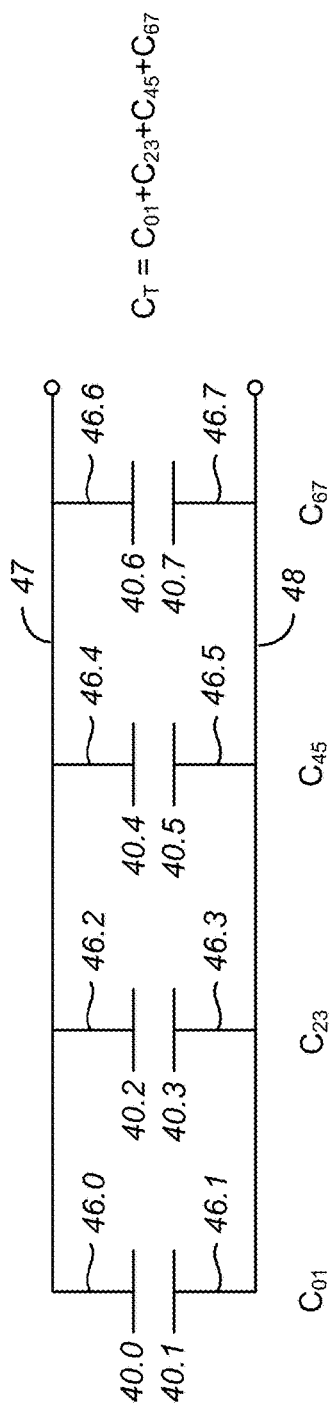
FIGS. 3 and 4 are circuit diagrams of different ways to interconnect individual capacitors in a stack of conductive material, resulting in different overall capacitances of the stack of conductive material as a whole.
Figure 4:
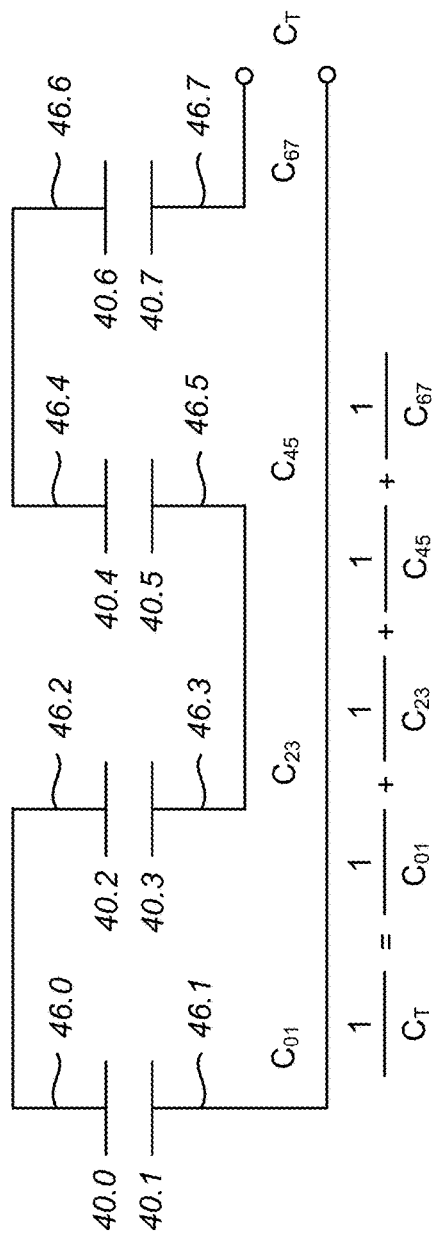

FIGS. 3 and 4 are circuit diagrams of different ways to interconnect individual capacitors in a stack of conductive material, resulting in different overall capacitances of the stack of conductive material as a whole.

The example of FIG. 3 has four capacitors connected to electrical conductors 46.0 and 46.1, 46.2 and 46.3, 46.4 and 46.5, and 46.6 and 46.7. To make one large-capacitance capacitor, the individual capacitors, identified as $C_{01}$, $C_{23}$, $C_{45}$ and $C_{67}$ in FIG. 3, can be placed in parallel. To do so, electrical conductors 46.0, 46.2, 46.4 and 46.6 are shorted to one another as a first terminal 47 and electrical conductors 46.1, 46.3, 46.5 and 46.7 are shorted to one another as a second terminal 48. Another example, shown in FIG. 4, shows each of capacitors $C_{01}$, $C_{23}$, $C_{45}$ and $C_{67}$ connected in series. While the total capacitance $C_T$ for the FIG. 4 example is less than the capacitance of any of the individual capacitors, placing the capacitors in series is useful when working with high voltages because each capacitor only sees a fraction of the total voltage. Other embodiments can connect series-connected capacitors and parallel-connected capacitors.

Figure 5:
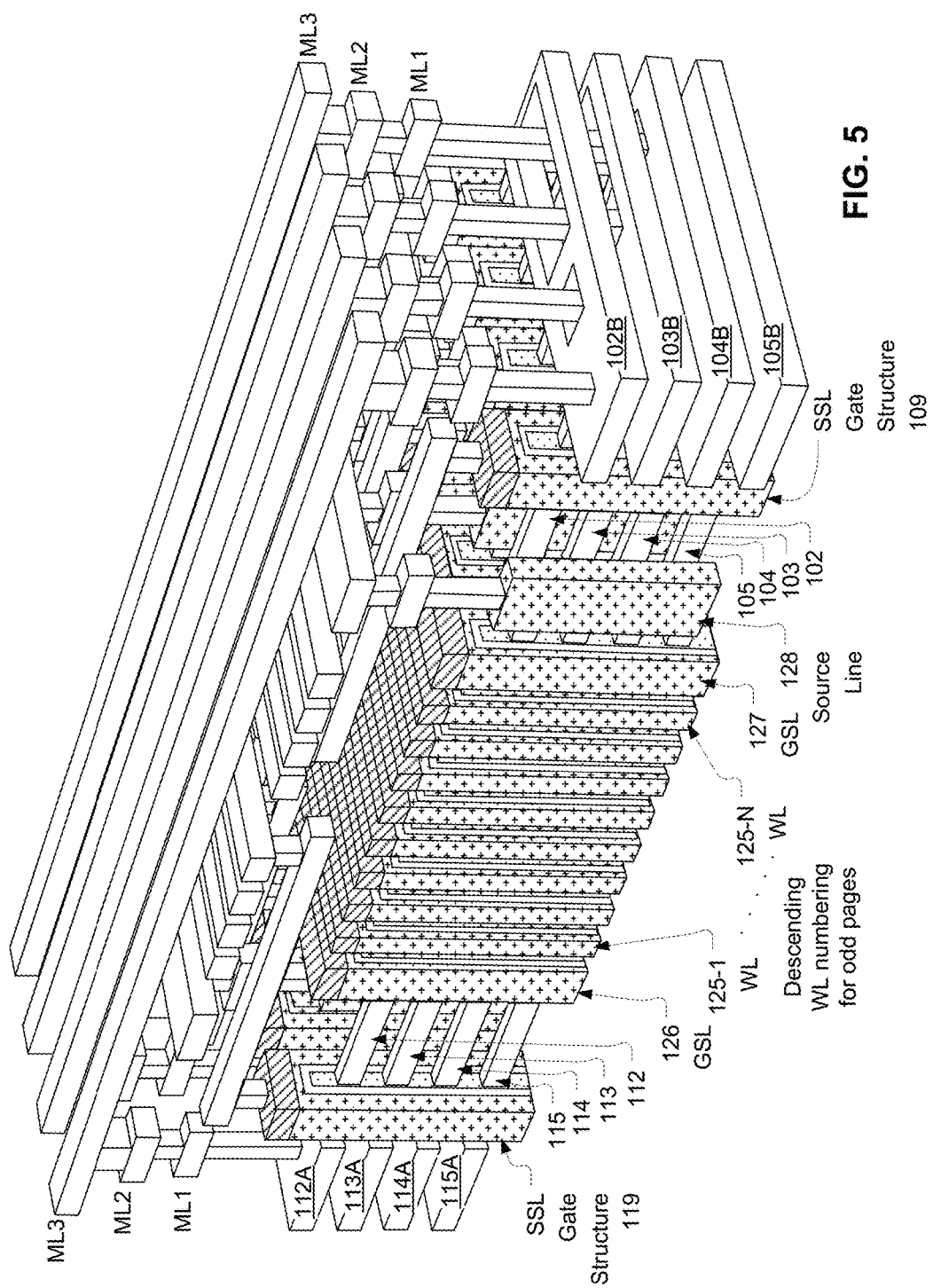
FIG. 5 is a perspective illustration of a three-dimensional, vertical gate NAND-flash memory device with stacks of conductive material from FIG. 1.

FIG. 5 is a perspective illustration of a three-dimensional, vertical gate NAND-flash memory device with stacks of conductive material from FIG. 1. The device illustrated in FIG. 1 includes stacks of active lines in active layers of the array, alternating with insulating lines. Insulating material is removed from the drawing to expose additional structure. For example, insulating lines are removed between the semiconductor lines in the stacks, and between the stacks of semiconductor lines.

In the example shown in FIG. 1, a multilayer array is formed on an insulating layer, and includes a plurality of word lines 125-1, . . . , 125-N conformal with the plurality of stacks. The plurality of stacks includes semiconductor lines 112, 113, 114, and 115 in multiple planes. Semiconductor lines in the same plane are electrically coupled together by bit line contact pads (e.g. 102B). The plurality of stacks are formed on a same substrate as stacks in capacitors, as shown in FIG. 1.

Bit line contact pads 112A, 113A, 114A, and 115A are on the near end of the figure terminate semiconductor lines, such as semiconductor lines 112, 113, 114, and 115. As illustrated, these bit line contact pads 112A, 113A, 114A, and 115A are electrically connected by interlayer connectors to different bit lines in an overlying patterned metal layer, e.g. ML3, for connection to decoding circuitry to select planes within the array. These bit line contact pads 112A, 113A, 114A, and 115A can be formed over stepped substrate structures as discussed below, and patterned at the same time that the plurality of stacks is defined.

Bit line contact pads 102B, 103B, 104B, and 105B on the far end of the figure terminate semiconductor lines, such as semiconductor lines 102, 103, 104, and 105. As illustrated, these bit line contact pads 102B, 103B, 104B, and 105B are electrically connected by interlayer connectors to different bit lines in an overlying patterned metal layer, e.g. ML3, for connection to decoding circuitry to select planes within the array. These bit line contact pads 102B, 103B, 104B, and 105B can be formed over stepped substrate structures as discussed below, and patterned at the same time that the plurality of stacks is defined.

In this example, any given stack of semiconductor lines is coupled to either the bit line contact pads 112A, 113A, 114A, and 115A, or the bit line contact pads 102B, 103B, 104B, and 105B, but not both. A stack of semiconductor bit lines has one of the two opposite orientations of bit line end-to-source line end orientation, or source line end-to-bit line end orientation. For example, the stack of semiconductor lines 112, 113, 114, and 115 has bit line end-to-source line end orientation; and the stack of semiconductor lines 102, 103, 104, and 105 has source line end-to-bit line end orientation.

The stack of semiconductor lines 112, 113, 114, and 115 terminated by the bit line contact pads 112A, 113A, 114A, and 115A, passes through SSL gate structure 119, ground select line GSL 126, word lines 125-1 WL through 125-N WL, ground select line GSL 127, and is terminated at the other end by source line 128. The stack of semiconductor lines 112, 113, 114, and 115 does not reach the bit line structures 102B, 103B, 104B, and 105B.

The stack of semiconductor lines 102, 103, 104, and 105 terminated by the bit line contact pads 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of semiconductor lines 102, 103, 104, and 105 does not reach the bit line structures 112A, 113A, 114A, and 115A.

A layer of memory material is disposed in interface regions at cross-points between surfaces of the semiconductor lines 112-115 and 102-105 and the plurality of word lines 125-1 through 125-$n$. Ground select lines GSL 126 and GSL 127 are conformal with the plurality of stacks, similar to the word lines.

Every stack of semiconductor lines is terminated at one end by bit line contact pads and at the other end by a source line. For example, the stack of semiconductor lines 112, 113, 114, and 115 is terminated by bit line contact pads 112A, 113A, 114A, and 115A, and terminated on the other end by a source line 128.

Bit lines and string select lines are formed at the metal layers ML1, ML2, and ML3. Bit lines are coupled to a plane decoder (not shown) in the peripheral area on the circuit. String select lines are coupled to a string select line decoder (not shown) in the peripheral area on the circuit.

The ground select lines GSL 126 and 127 can be patterned during the same step that the word lines 125-1 through 125-$n$ are defined. Ground select devices are formed at cross-points between surfaces of the plurality of stacks and ground select lines GSL 126 and 127. The SSL gate structures 119 and 109 can be patterned during the same step that the word lines 125-1 through 125-$n$ are defined. String select devices are formed at cross-points between surfaces of the plurality of stacks and string select (SSL) gate structures 119 and 109. These devices are coupled to decoding circuitry for selecting the strings within particular stacks in the array.

Figure 6:
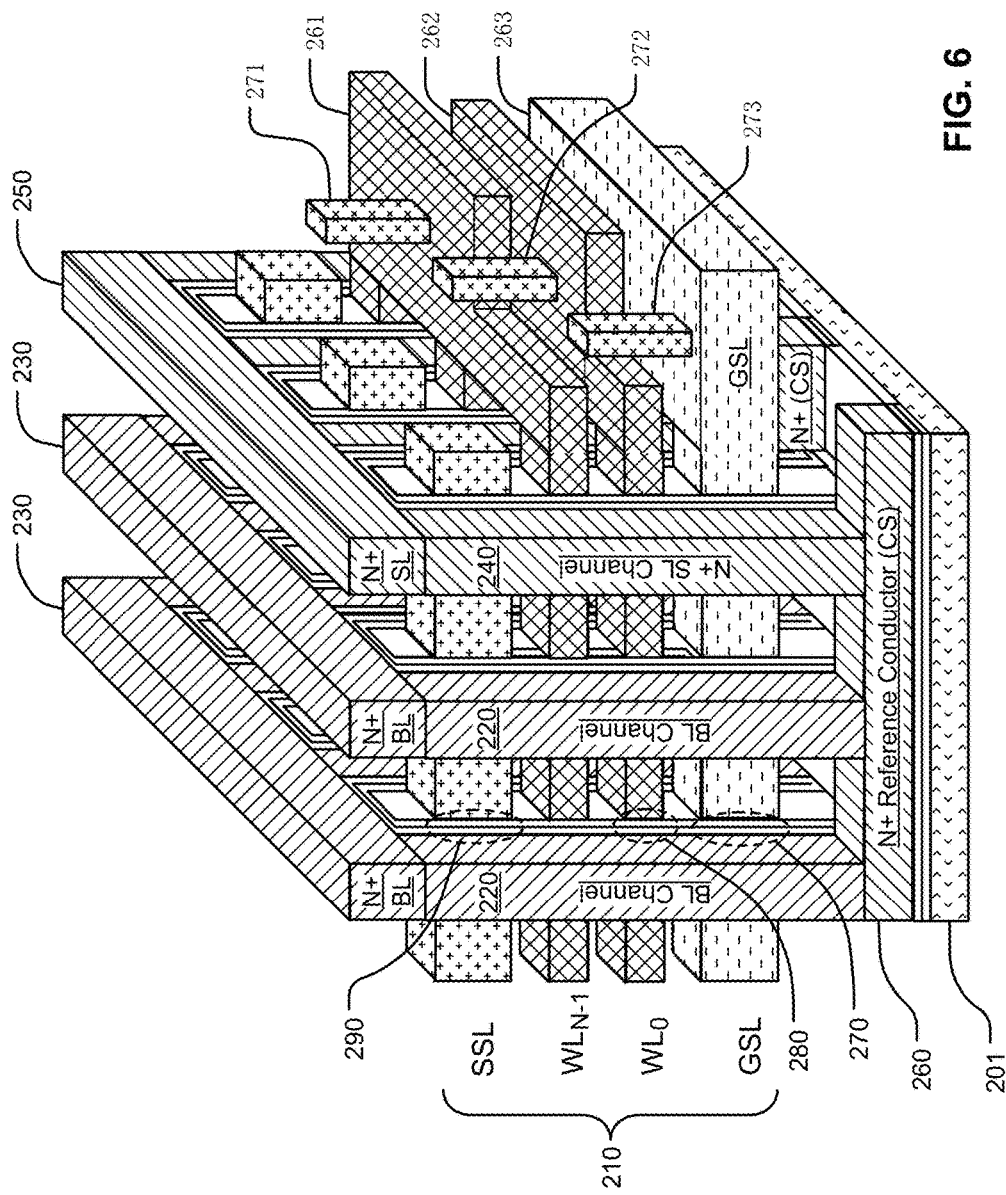
FIG. 6 is a perspective illustration of an alternative three-dimensional, vertical channel NAND-flash memory device with stacks of conductive material from FIG. 1.

FIG. 6 is a perspective illustration of an alternative three-dimensional, vertical channel NAND-flash memory device with stacks of conductive material from FIG. 1.

The memory device includes an array of NAND strings of memory cells, and can be a double-gate vertical channel memory array (DGVC). The memory device includes an integrated circuit substrate 201, and a plurality of stacks of conductive strips alternating with insulating material. The stacks include at least a bottom plane of conductive strips (GSL), a plurality of intermediate planes of conductive strips (WLs), and a top plane of conductive strips (SSLs). The stacks are formed on a same substrate as stacks in capacitors, as shown in FIG. 1.

For example, a stack 210 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. The insulating material is removed from the drawing to expose additional structure. For example, the insulating material is removed between the conductive strips in the stacks, and is removed between the stacks of conductive strips.

In the example shown in FIG. 6, a plurality of bit line structures is arranged orthogonally over, having surfaces conformal with, the plurality of stacks, including inter-stack semiconductor body elements 220 between the stacks and linking elements 230 over the stacks connecting the semiconductor body elements 220.

The memory device includes memory elements in interface regions at cross-points 280 between side surfaces of the conductive strips in the plurality of intermediate planes (WLs) in the stacks and the inter-stack semiconductor body elements 220 of the plurality of bit line structures.

A reference conductor 260 is disposed between the bottom plane (GSL) of conductive strips and the integrated circuit substrate 201. At least one reference line structure is arranged orthogonally over the plurality of stacks, including inter-stack semiconductor elements 240 between the stacks in electrical communication with the reference conductor 260, and linking elements 250 over the stacks 210 connecting the inter-stack semiconductor elements 240. The semiconductor elements 240 can have a higher conductivity than the semiconductor body elements 220.

The memory device includes string select switches 290 at interface regions with the top plane of conductive strips, and reference select switches 270 at interface regions with the bottom plane (GSL) of conductive strips.

In the example shown in FIG. 6, the memory device can further include decoding circuitry coupled to the conductive strips in the plurality of stacks. The decoding circuitry can include word line decoding circuits, and string selection line decoding circuits coupled to the top plane of conductive strips (SSLs) in the plurality of stacks. String selection lines in the top plane of conductive strips are independently coupled to and controlled by the string selection line decoding circuits.

Conductive strips in the intermediate planes (WLs), and conductive strips in the bottom plane (GSL) are connected together to reduce decoder areas and consequently an overall size of the memory device. Conductive strips in the top plane (SSL) are individually decoded to allow correct bit line decoding.

The memory device can include contact pads which provide linking elements, such as contact pads 261 and 262, connecting sets of word lines in the intermediate planes (WL), and interlayer connectors, such as interlayer connectors 271 and 272, coupled to landing areas in the contact pads 261 and 262, and to the word line decoding circuits (not shown). The landing areas are at interface regions between bottom surfaces of the interlayer connectors and top surfaces of the contact pads.

In the example shown in FIG. 6, interlayer connectors (e.g. 271 and 272) for sets of word lines at multiple layers in the plurality of intermediate planes are arranged in a staircase structure, and are connected to landing areas at two different layers in the plurality of intermediate planes. The contact pads can be formed over a stepped substrate structure as described below.

The staircase structure can be formed in a vertical contact region near the boundary of a memory cell region for the array of memory cells and a peripheral region for components of peripheral circuits. The vertical contact region can include contact pads 261 and 262, and interlayer connectors 271 and 272.

The memory device can include ground selection line decoding circuits coupled to the at least one bottom plane (GSL) of conductive strips in the plurality of stacks. The memory device can include contact pads, such as a contact pad 263, connecting sets of ground selection lines in the bottom plane (GSL) of conductive strips, and interlayer connectors, such as an interlayer connector 273, coupled to landing areas in the contact pads, and to the ground selection line decoding circuits (not shown).

In the example shown in FIG. 6, the memory device includes a first overlying conductive layer (not shown) connected to the plurality of bit line structures, including a plurality of global bit lines coupled to sensing circuits. The memory device also includes a second overlying conductive layer (not shown) connected to the at least one reference conductor structure, coupled to a reference voltage source.

Insulating layers in the stack can be the same as or different from the other layers. Representative insulating materials that can be used include a silicon oxide, a silicon nitride, a silicon oxynitride, silicate, or other materials. Low dielectric constant (low-k) materials having a dielectric constant smaller than that of silicon dioxide, such as $SiCHO_x$, can be used. High dielectric constant (high-k)

materials having a dielectric constant greater than that of silicon dioxide, such as $HfO_x$, HfON, $AlO_x$, $RuO_x$, $TiO_x$, can be used also.

Conductor or semiconductor layers in the stack can be the same as or different from the other layers. Representative materials that can be used include semiconductors including undoped and doped polysilicon (using dopants such as As, P, B), combinations of semiconductor structures, silicides including TiSi, CoSi, oxide semiconductors, including InZnO, InGaZnO, and combinations of semiconductors and silicides. Conductive layers in the stack can also be a metal, a conductive compound, or combinations of materials including Al, Cu, W, Ti, Co, Ni, TiN, TaN, TaAlN, and others.

Figure 7:
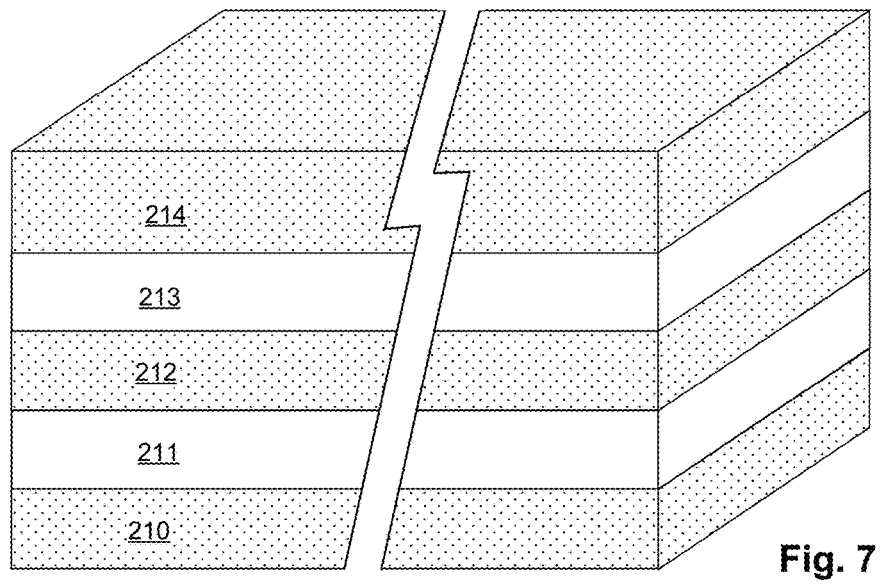
FIGS. 7-8 are steps in a process for forming the stacks of conductive material for both a capacitor and a 3D NAND array on a same substrate from FIG. 1.
Figure 8:
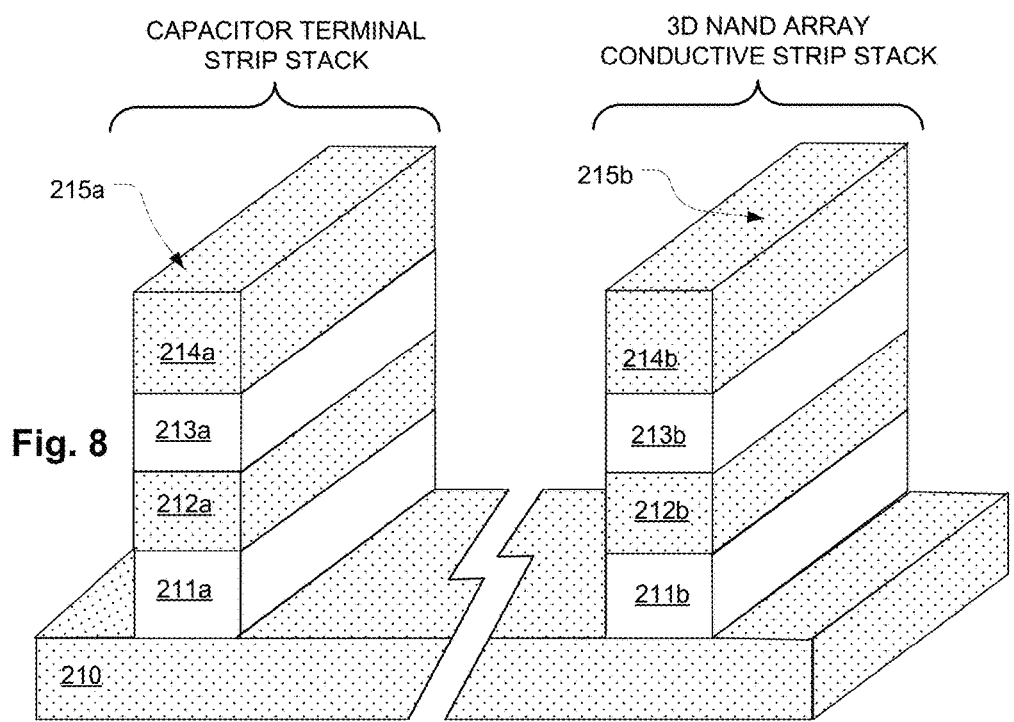

FIGS. 7-8 are steps in a process for forming the stacks of conductive material for both a capacitor and a 3D NAND array on a same substrate from FIG. 1.

In FIG. 7, a structure is shown which results from alternating deposition of insulating layers 210, 212, 214 and semiconductor layers 211, 213 formed using doped semiconductors for example in a blanket deposition in the array area of a chip. Depending on the implementation, the semiconductor layers 211, 213 can be implemented using polysilicon or epitaxial single crystal silicon having n-type or p-type doping. A typical thickness range of the semiconductor layers is from 200 to 500 angstroms.

Inter-level insulating layers 210, 212, 214 can be implemented for example using silicon dioxide, other silicon oxides, or silicon nitride. These layers can be formed in a variety of ways, including low pressure chemical vapor deposition LPCVD processes available in the art. The zigzag lines through the insulator layer 210 indicate that the capacitor and a 3D NAND array are spaced apart on the same insulator layer 210. In another embodiment, the stacks are spaced apart on a same conductive substrate, and the bottom of each stack is an insulator strip.

FIG. 8 shows the result of a first lithographic patterning step used to define a plurality of ridge-shaped stacks 250 of semiconductor strips, where the semiconductor strips are implemented using the material of the semiconductor layers 211, 213, and separated by the insulating layers 212, 214. Deep, high aspect ratio trenches can be formed in the stack, supporting many layers, using lithography based processes applying a carbon hard mask and reactive ion etching.

The same insulator layer 210 is the base for stacks of conductive material that are in both a capacitor and a 3D NAND array. Stack 215a is included in a capacitor device. Stack 15b is included in a 3D NAND array.

Conductive material strips 213a and 213b share a same plane position and thus have a same vertical position relative to each other. Conductive material strips 211a and 211b also share a same plane position and thus have a same vertical position relative to each other. Conductive material strips 213a and 213b have a different plane position relative to conductive material strips 211a and 211b; thus conductive material strips 213a and 213b have a different vertical position relative to conductive material strips 211a and 211b.

The zigzag lines through the insulator layer 210 indicate that the capacitor and a 3D NAND array are spaced apart on the same insulator layer 210. In another embodiment, the stacks are spaced apart on a same conductive substrate, and the bottom of each stack is an insulator strip.

The various methods typically use a series of deposition and etching steps to do so. Different methods are discussed in Xie, Peng and Smith, Bruce W., *Analysis of Higher-Order Pitch Division for Sub-32 nm Lithography*, Optical Microlithography XXII, Proc. of SPIE Vol. 7274, 72741Y, © 2009 SPIE. Multiple patterning methods are also described in U.S. patent application Ser. No. 12/981,121, filed 29 Dec. 2010, entitled MULTIPLE PATTERNING METHOD, having a common assignee and a common inventor with this application.

Other dielectrics can be used, including low dielectric constant (low-k) materials such as silicon nitride or other low-k dielectrics. In some examples, the capacitor structures can be made on what could be called a rough surface conductor so that the upper portion of substrate 12 and ridges 16 would be made of electrical conductors and thus act as an electrically conductive terminal layer. In general, the conductors can be a metal or combination of metals, include Al, Cu, W, Ti, Co, Ni. The conductors can also be metal compounds, such as TiN/TaN/AlCu, or semiconductor compounds, such as heavily doped Si (using dopants such as As, P, B.); silicides including TiSi, CoSi. Also, typical dielectric materials include $SiO_2$, SiN, SiON. However, high dielectric constant (high-k) materials having a dielectric constant greater than that of silicon dioxide, such as $HfO_x$, HfON, $AlO_x$, $RuO_x$, $TiO_x$, are generally preferred. The dielectric materials may also be a multi-layer, such as silicon oxide/silicon nitride, silicon oxide (ONO), silicon oxide, high-k dielectric, silicon oxide (O/high-k/O), which provide higher k values and create less concern about capacitance leakage.

A suitable deposition technique for dielectric layer 22 would be, for example, atomic layer deposition ALD, high density plasma chemical vapor deposition HDCVD, low density plasma chemical vapor deposition LPCVD, etc., depending on the chosen materials. The process of depositing the terminal layers 20 and dielectric layers 22 proceeds until a desired number of serpentine plate capacitors 18 are created. The size of trench width 26 and the ratio between trench width 26 and ridge height 32 typically limits the number of terminal and dielectric layers 20, 22. The size of trench width 26 is usually greater than ridge width 30.

Figure 9:
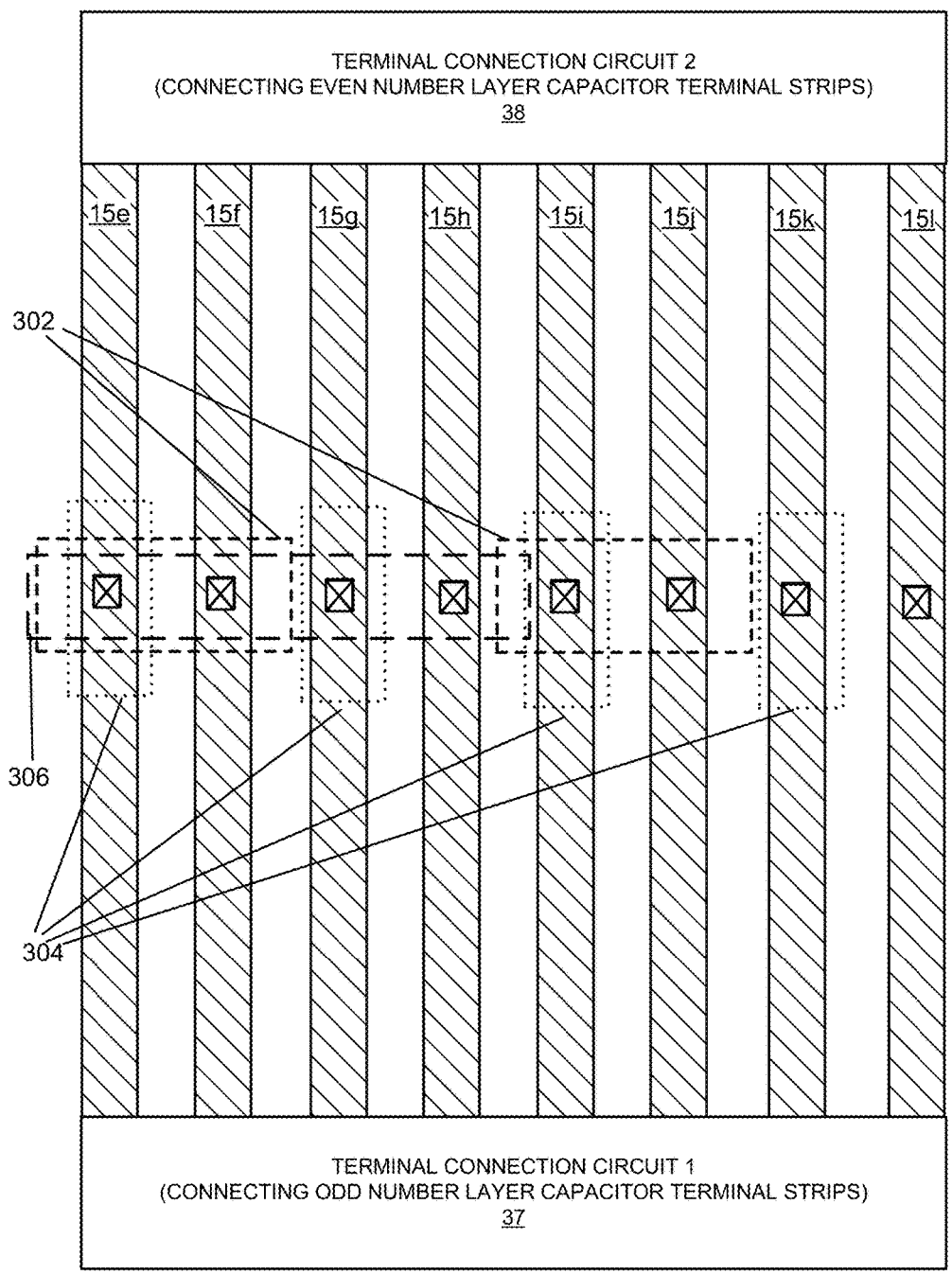
FIG. 9 is a top view of a capacitor with stacks of conductive material, with an overlay of mask regions defining varying etch depths for electrical conductors.

FIG. 9 is a top view of a capacitor with stacks of conductive material, with an overlay of mask regions defining varying etch depths for electrical conductors. In this top view, the stacks of conductive strips extend into and out of the page to the extent of the heights of the stacks.

Shown are the stacks of conductive material 15e, 15f, 15g, 15h, 15i, 15j, 15k, and 15l. Other embodiments have fewer or more stacks of conductive material. The stacks have lengths with a first end and a second end. The first ends are interconnected electrically by terminal connection circuit 1 37 and the second ends are interconnected electrically by terminal connection circuit 2 38. Terminal connection circuit 1 37 interconnects "odd" numbered layers of capacitor terminal strips. Terminal connection circuit 2 38 interconnects "even" numbered layers of capacitor terminal strips. Such interconnection can be seen in FIG. 2.

The dimensions of the capacitor terminal strips can be sufficiently large such that even the minimal resistance of the conductive strips results in unacceptably long RC delay. An example RC delay calculation of the capacitor in FIG. 2 follows:

$$RC = (R) * (C)$$
$$= (Rs(L/W)/(\# \text{ layers in parallel})) *$$
$$((\epsilon_0 \; \epsilon_r / \text{thickness})(\text{width length})(\# \text{ capacitors in parallel}))$$

-continued $$= (10^5 (1.8/1.376)/(4)) *$$

$$((8.864 \quad 10^{-14} \quad 3.9/(250 \quad 10^{-8}))(1.8 \quad 1.376 \quad 10^{-8})(7))$$

$$= 0.8 \text{ nanoseconds}$$

This example is different in other embodiments, as the variables in other embodiments can be changed: the material which changes Rs and $\epsilon_r$, the dimensions of the material which changes thickness, the layout which changes L and W of the resistance, the # layers in parallel, and the # of capacitors in parallel.

To decrease the resistance and thus shorten the RC delay, the capacitor terminal strips at different layers can be coupled to terminal connection circuit 1 37 or terminal connection circuit 2 38 not just at ends of the stacks, but also at an intermediate position between the first ends and the second ends. Such more frequent terminal connections are called strap connections. Strap connections reduce the resistance L in the example RC delay calculation.

The strap connections are defined by the overlay of mask regions defining varying etch depths for the strap connections. Mask region 306 defines an etch depth of 4 layers. Mask regions 302 define an etch depth of 2 layers. Mask regions 304 define an etch depth of 1 layer. In combination, the etch depths vary from 0 layers to 7 layers, depending on the combination of mask regions 302, 304, and 306 which overlie each other above particular stacks of conductive material. The conductive material stacks have the following combined etch depths for the strap connections. 15e has a 7 layer etch depth, 15f has a 6 layer etch depth, 15g has a 5 layer etch depth, 15h has a 4 layer etch depth, 15i has a 3 layer etch depth, 15j has a 2 layer etch depth, 15k has a 1 layer etch depth, and 15l has a 0 layer etch depth.

Figure 10:
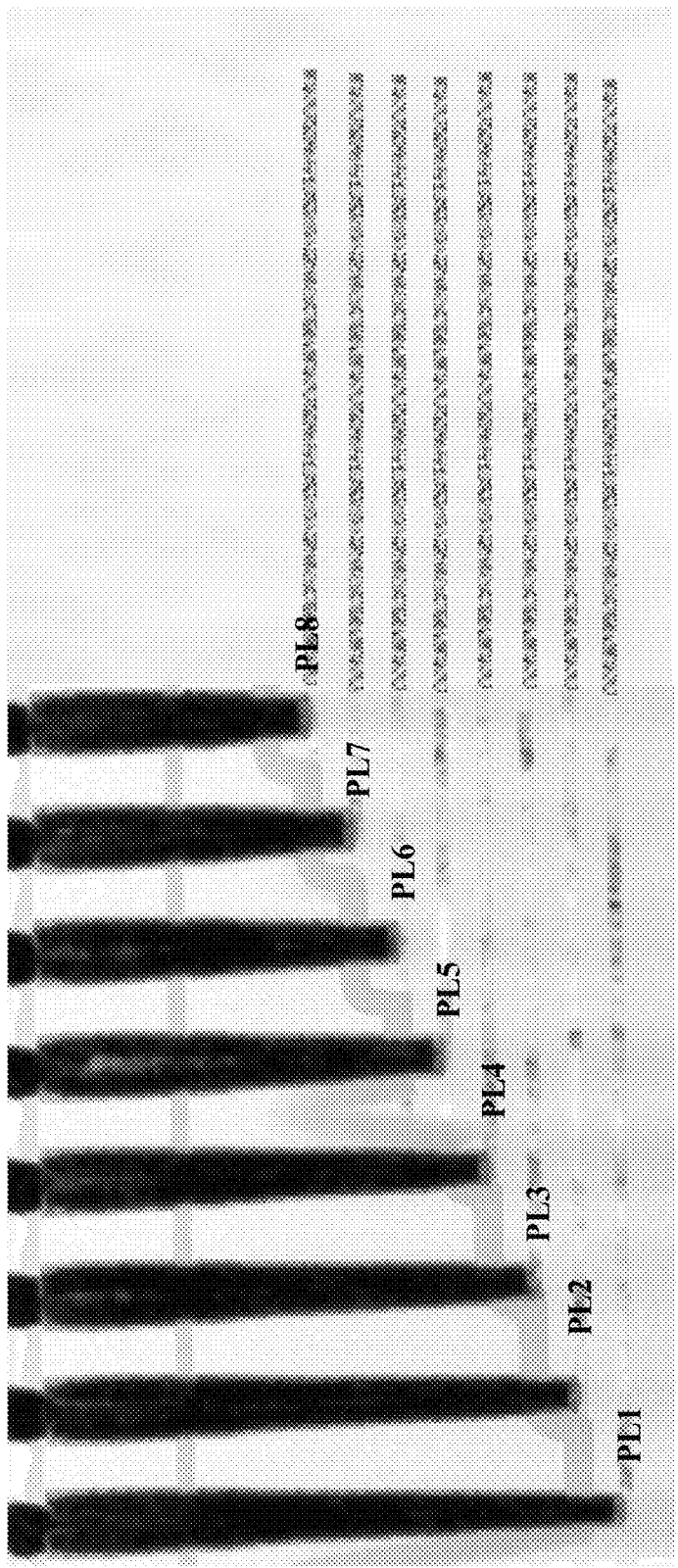
FIG. 10 is a side view of a capacitor with stacks of conductive material.

FIG. 10 is a side view of a capacitor with stacks of conductive material. The different layers of conductive material are contacted by conductive plugs of different depths. Such an array of conductive plugs can be used as the strap contacts or as the terminal connection circuits in FIG. 9.

The staircase plugs can have the same pitch as the stacks of conductive material.

FIGS. 11-14 illustrate a sequence of steps creating electrical conductors at an interconnect region in contact with extensions of the terminal layers, such as shown in the example of FIG. 10.

The different terminal layer extensions 40 are identified in the figures as terminal layer extensions 40.0 through 40.7 with the top most being 40.0. The locations for the electrical conductors 46 for contact with the corresponding terminal layer extensions 40 are labeled 0 through 7 in the figures. Similar numbering occurs with dielectric layer extensions 42. When an interconnect region 44 is located at the top of one or more dielectric ridges 16 or at the bottom of one or more trenches 15, then terminal conductors 46 will directly contact the terminal layers 20 with terminal layer extensions 40 being unnecessary.

Figure 11:
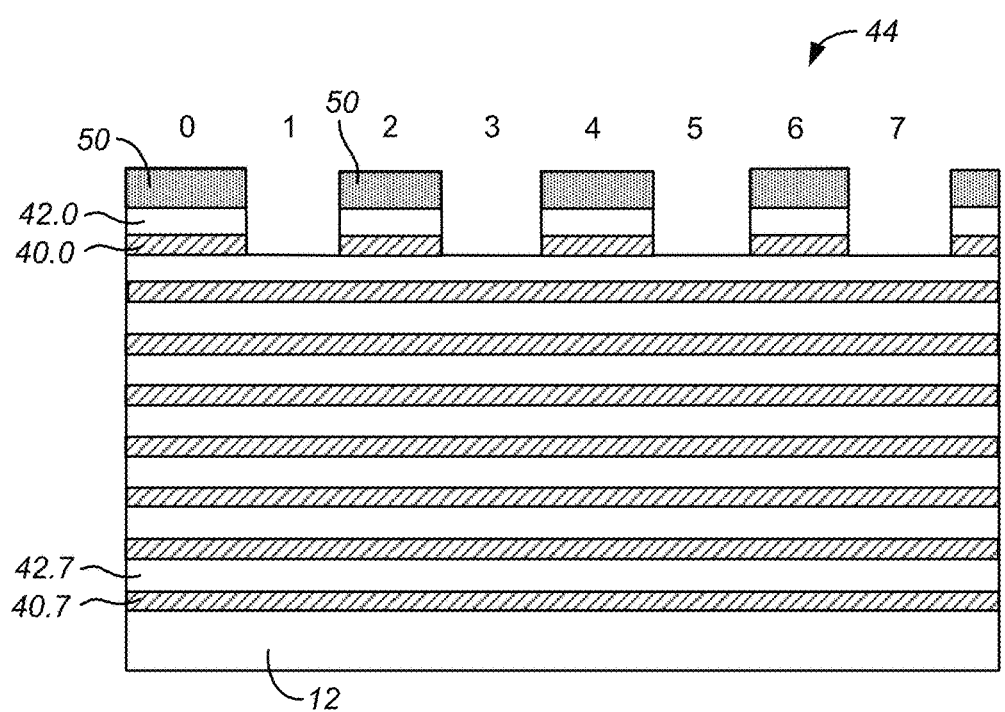
FIGS. 11-14 illustrate a sequence of steps creating electrical conductors at an interconnect region in contact with extensions of the terminal layers, such as shown in the example of FIG. 10, providing electrical access to a serpentine, stacked plate capacitor assembly.
Figure 12:
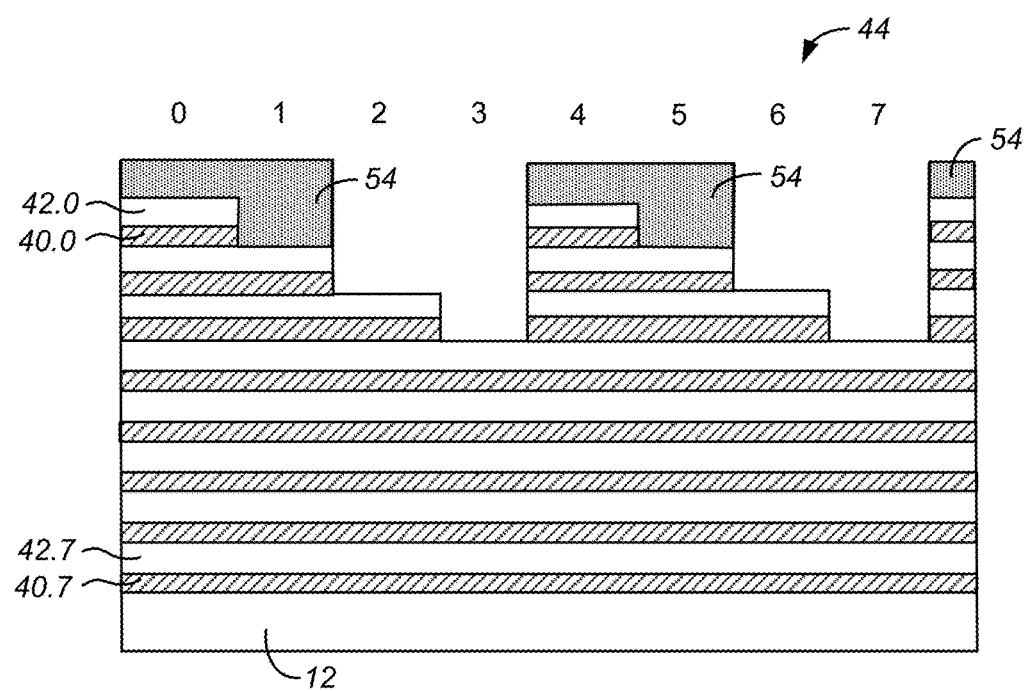
Figure 13:
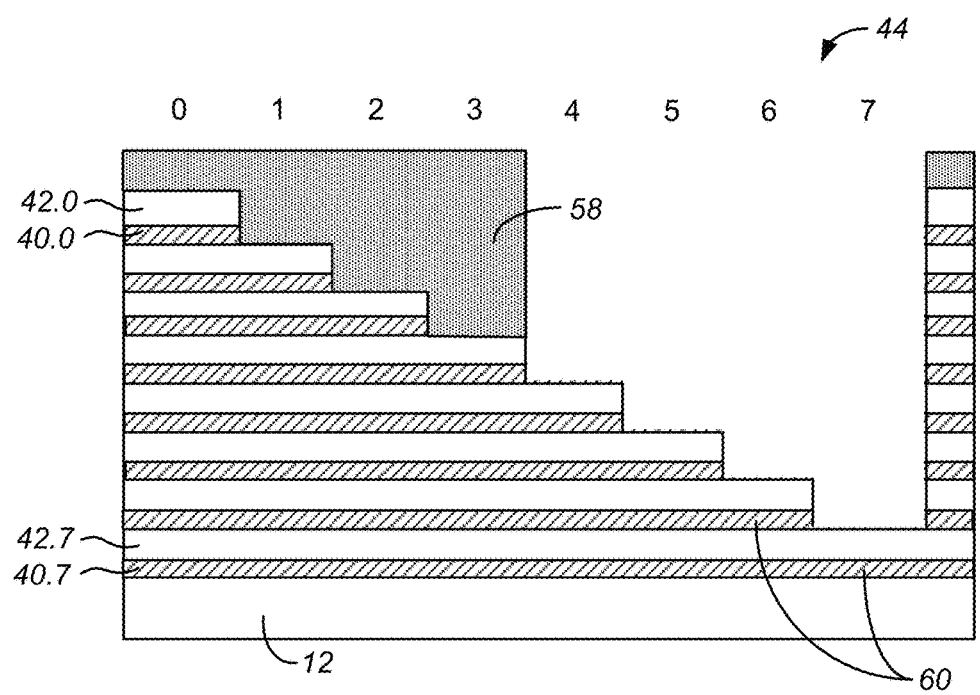
Figure 14:
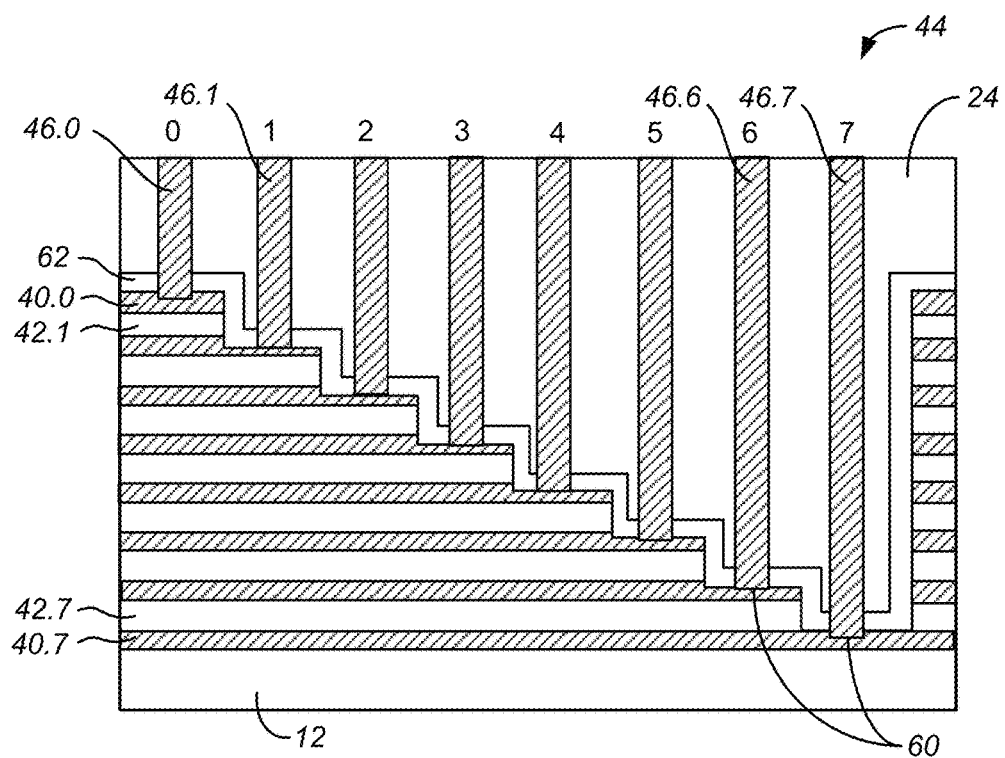

A first photoresist mask 50, shown in FIG. 11, is created on dielectric layer extension 42.0 at electrical conductor locations 0, 2, 4, 6 and on the far side of location 7. The regions covered by photoresist masks are sometimes referred to as mask regions. The regions not covered by first photoresist mask 50, sometimes referred to as etch regions, are then etched one level through dielectric layer extension 42.0 and terminal layer extension 40.0 to create the structure shown in FIG. 11. Next, as shown in FIG. 12, first photoresist mask 50 is removed and then a second photoresist mask 54 is formed on the resulting structure of FIG. 12 to cover electrical conductor locations 0, 1, 4, 5, and on the far side of location 7. The structure is then etched two levels at the exposed regions to create the structure shown in FIG. 12. Next, second photoresist mask 54 is removed and a third photoresist mask 58 is formed to cover electrical conductor locations 0, 1, 2, 3 and on the far side of location 7. The exposed portions of the structure are then etched four levels to create the structure shown in FIG. 13.

Thereafter, third photoresist mask 58 is removed and an optional conformal dielectric barrier layer material can be deposited on the exposed surfaces, including over the stair stepped landing pads 60, to create a dielectric barrier layer 62. Barrier layer 62 is used as an etching stop and is can be made of silicon nitride. Dielectric fill layer 24 is deposited on the resulting structure. Appropriate vias are then formed through dielectric fill layer 24 and through the dielectric barrier layer 62 covering the landing pad 60 of each of terminal layer extensions 40.0-40.7. Electrical conductors 46 are then formed in the vias to provide electrical connection with landing pads 60 of terminal layer extensions 40 and thus with terminal layers 20 capacitors to create the structure shown in FIG. 14. Electrical conductors 46 can be made of the same electrical conductor materials discussed above. However, doped Si, W and Cu may be preferred because of the existing knowledge about chemical mechanical polishing of these electrically conductive materials. Electrical conductors 46 are identified as 46.0-46.7 corresponding to locations 0-7.

More than one interconnect region 44 could be used to access the landing pads 60 at the various levels. Some or all of the landing pads 60 at the different levels could be accessed by the same or different interconnect region 44.

The process for creating electrical conductors 46 can be referred to as a binary process, based on $2^0 \ldots 2^{n-1}$ with n being the number of etching steps. That is, first photoresist mask 50 alternatingly covers $2^0$ landing pads 60 and exposes $2^0$ landing pads 60; second photoresist mask 54 alternatingly covers $2^1$ landing pads 60 and exposes $2^1$ landing pads 60; third photoresist mask 58 alternatingly covers $2^2$ landing pads 60 and exposes $2^2$ landing pads 60; and so on. Using this binary process, n masks can be used to provide access to $2^n$ landing pads 60 for $2^n$ terminal conductors 46. Thus, using three masks provides access to 8 landing pads 60 for 8 terminal conductors 46. Using five masks would provide access to 32 landing pads 60 by 32 electrical conductors 46. The order of etching need not be in the order of n−1=0, 1, 2, .... For example, the first etching step could be with n−1=2, the second could be with n−1=0, and the third could be with n−1=1.

Further information on similar techniques and methods for connecting electrical conductors 46 to landing pads 60 are disclosed in U.S. patent application Ser. No. 13/049,303, filed 16 Mar. 2011, entitled REDUCED NUMBER OF MASK FOR IC DEVICE WITH STACKED CONTACT LEVELS; and in U.S. patent application Ser. No. 13/114,931, filed 24 May 2011, entitled MULTILAYER CONNECTION STRUCTURE AND MAKING METHOD, the disclosures of which are incorporated by reference. These two applications and the present application have a common assignee.

Figure 15:
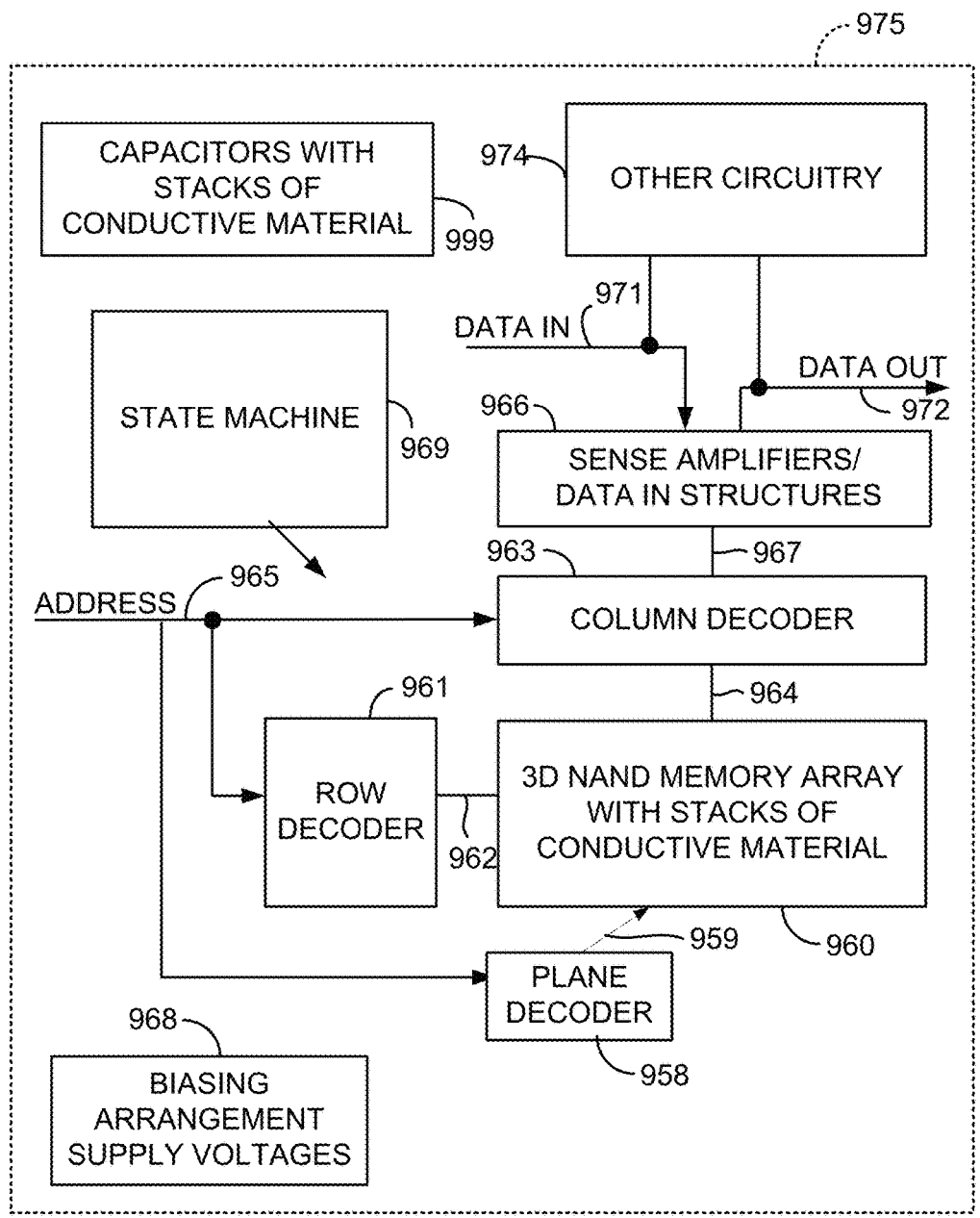
FIG. 15 is a simplified block diagram of an integrated circuit with stacks of conductive material for both a capacitor and a 3D NAND array on a same substrate.

FIG. 15 is a simplified block diagram of an integrated circuit with stacks of conductive material for both a capacitor and a 3D NAND array on a same substrate.

The integrated circuit line 975 includes a 3D NAND flash memory array 960, implemented as described herein, on a semiconductor substrate with stacks of conductive material and with capacitors with stacks of conductive material. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The substrate also includes capacitors with stacks of conductive material 999 on the same substrate as the 3D NAND flash memory array 960.

The above descriptions may have used terms such as above, below, top, bottom, over, under, et cetera. These terms may be used in the description and claims to aid understanding of the invention and not used in a limiting sense.

Figure 16:
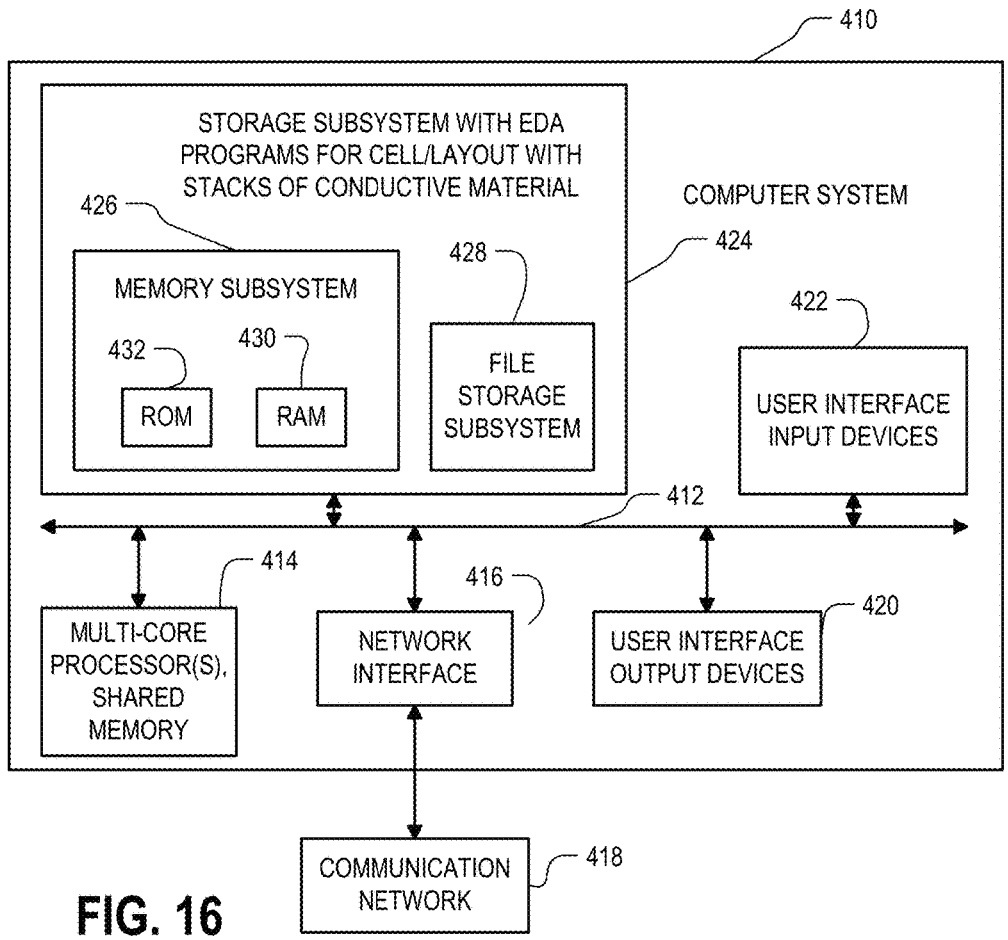
FIG. 16 is a simplified block diagram of a computer system that implements software incorporating aspects of the present technology.

FIG. 16 is a simplified block diagram of a computer system 110 that implements software incorporating aspects of the present invention. While the present paper indicates individual steps carrying out specified operations, it will be appreciated that each step is actually implemented with software instructions that cause the computer system 110 to operate in the specified manner. The group of software instructions and data to implement a particular step, in conjunction with the processing subsystem and other components of the computer system which enable such software instructions to be executed, constitute a module which implements the particular step.

Computer system 210 typically includes a processor subsystem 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210 or onto computer network 218.

User interface output devices 220 may include a display subsystem, a printer, a fax machine, or nonvisual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 110 to the user or to another machine or computer system.

Non-transitory storage subsystem 224 stores the basic programming and data constructs that provide the functionality of certain embodiments of the present technology. For example, the various modules implementing the functionality of certain embodiments of the invention may be stored in storage subsystem 224. Some examples are EDA programs for a cell or layout including stacks of conductive material for NAND memory arrays and capacitors on the same substrate as described herein. These software modules are generally executed by processor subsystem 214. Storage subsystem 224 also represents storage accessible to the computer system on which the various software mentioned herein are stored. In another embodiment some or all of the software is located on storage accessible to the computer system via the network 218.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 228. The host memory 226 contains, among other things, computer instructions which, when executed by the processor subsystem 214, cause the computer system to operate or perform functions as described herein. As used herein, processes and software that are said to run in or on "the host" or "the computer", execute on the processor subsystem 214 in response to computer instructions and data in the host memory subsystem 226 including any other local or remote storage for such instructions and data.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, a server farm, or any other data processing system or user device. Due to the ever changing nature of computers and networks, the description of computer system 210 is intended only as a specific example for purposes of illustrating certain embodiments of the present invention. Many other configurations of computer system 210 are possible having more or less components than the computer system depicted.

Figure 16A:
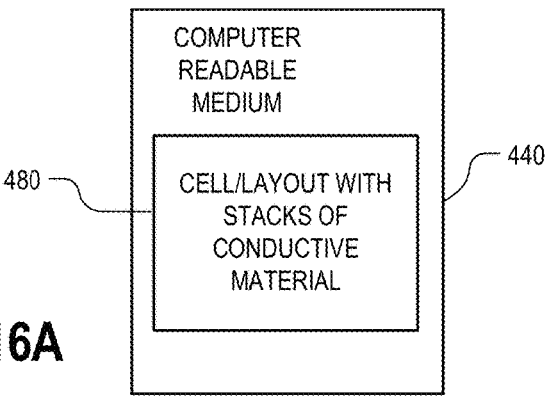
FIG. 16A shows a nontransitory computer readable medium storing computer readable data with aspects of the present technology.

FIG. 16A shows a nontransitory computer readable medium 240 which stores a cell or layout 280 with stacks of conductive material in a NAND array and in a capacitor on a same substrate. The nontransitory computer readable medium can be any of the nontransitory memories discussed in connection with the storage subsystem 224.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. Any and all patents, patent applications and printed publications referred to above are incorporated by reference.

The invention claimed is:

1. A nontransitory computer readable medium with a layout of an integrated circuit design responsive to a computer executing a circuit design program which reads the layout, comprising:
the layout for the integrated circuit design including designs for a plurality of masks, the integrated circuit design including:
a 3D NAND memory array with a stack of conductive strips; and
a capacitor with a plurality of stacks of capacitor terminal strips, each stack in the plurality of stacks of capacitor terminal strips having N capacitor terminal strips disposed at N plane positions relative to a substrate,
wherein, multiple masks in the plurality of masks each define at least one conductive strip in the stack of conductive strips in the 3D NAND memory array and at least one capacitor terminal strip in the stacks of capacitor terminal strips,
stacks in the plurality of stacks of capacitor terminal strips including a first plurality of capacitor terminal strips at plane positions $P1(i)$ for i going from 1 to N when i is odd alternating with a second plurality of capacitor terminal strips at plane positions $P2(j)$ for j going from 2 to N when j is even, capacitor terminal strips in multiple stacks of capacitor terminal strips at the plane positions $P1(i)$ in the first plurality electrically connected together via a first terminal connection circuit at first ends, and capacitor terminal strips in multiple stacks of capacitor terminal strips at the plane positions $P2(j)$ in the second plurality electrically connected together via a second terminal connection circuit at second ends opposite the first ends; and
a conductive plug electrically connected to at least one of the capacitor terminal strips at an intermediate point in between the first end and the second end.

2. The computer readable medium of claim 1, wherein the stack of conductive strips is at least one of: transistor channels in the 3D NAND memory array, conductors routing signals that select memory cells in the 3D NAND memory array, and conductors routing output from the 3D NAND memory array.

3. The computer readable medium of claim 1, wherein the 3D NAND memory array is a vertical gate memory array, and the conductive strips in the stack are NAND transistor channels in the vertical gate memory array.

4. The computer readable medium of claim 1, wherein the 3D NAND memory array is a vertical channel memory array, and the conductive strips in the stack of conductive strips are word lines in the vertical channel memory array.

5. The computer readable medium of claim 1, the first plurality of capacitor terminal strips electrically connected together in parallel via the first terminal connection circuit and the second plurality of capacitor terminal strips electrically connected together in parallel via the second terminal connection circuit.

6. The computer readable medium of claim 5, the plurality of stacks of capacitor terminal strips having lengths between the first ends and second ends, the first plurality of capacitor terminal strips alternating with the second plurality of capacitor terminal strips, the first plurality of capacitor terminal strips in the plurality of stacks of capacitor terminal strips electrically connected together via the first ends and at intermediate points in between the first ends and second ends.

7. A method of making an integrated circuit, comprising:
making a 3D NAND memory array with a stack of conductive strips and a capacitor with a plurality of stacks of capacitor terminal strips, each stack in the plurality of stacks of capacitor terminal strips having N capacitor terminal strips disposed at N plane positions relative to a substrate, including:
in a same etch, defining the stack of conductive strips and the stacks of capacitor terminal strips, stacks in the plurality of stacks of capacitor terminal strips including a first plurality of capacitor terminal strips at plane positions $P1(i)$ for i going from 1 to N when i is odd alternating with a second plurality of capacitor terminal strips at plane positions $P2(j)$ for j going from 2 to N when j is even,
capacitor terminal strips in multiple stacks of capacitor terminal strips at the plane positions $P1(i)$ in the first plurality electrically connected together via a first terminal connection circuit at first ends, and capacitor terminal strips in multiple stacks of capacitor terminal strips at the plane positions $P2(j)$ in the second plurality electrically connected together via a second terminal connection circuit at second ends opposite the first ends,
wherein multiple conductive strips in the stack of conductive strips and multiple capacitor terminal strips of the stacks of capacitor terminal strips share the same plurality of plane positions relative to the substrate, different plane positions in the same plurality of plane positions characterize different capacitor terminal strips in the stack of capacitor terminal strips and different conductive strips in the stack of conductive strips, and a same plane position characterizing both a conductive strip in the stack of conductive strips and a capacitor terminal strip in the stack of capacitor terminal strips indicates that the conductive strip and the capacitor terminal strip have a same vertical position relative to each other; and making a conductive plug electrically connected to at least one of the capacitor terminal strips at an intermediate point in between the first end and the second end.

8. The method of claim 7, wherein the stack of conductive strips is at least one of: transistor channels in the 3D NAND memory array, conductors routing signals that select memory cells in the 3D NAND memory array, and conductors routing output from the 3D NAND memory array.

9. The method of claim 7, wherein the 3D NAND memory array is a vertical gate memory array, and the conductive strips in the stack are NAND transistor channels in the vertical gate memory array.

10. The method of claim 7, wherein the 3D NAND memory array is a vertical channel memory array, and the conductive strips in the stack of conductive strips are word lines in the vertical channel memory array.

11. The method of claim 7, the first plurality of capacitor terminal strips electrically connected together in parallel via the first terminal connection circuit and the second plurality of capacitor terminal strips electrically connected together in parallel via the second terminal connection circuit.

12. The method of claim 11, the plurality of stacks of capacitor terminal strips having lengths between the first ends and second ends, the first plurality of capacitor terminal strips alternating with the second plurality of capacitor terminal strips, the first plurality of capacitor terminal strips in the plurality of stacks of capacitor terminal strips electrically connected together via the first ends and at intermediate points in between the first ends and second ends.

* * * * *